United States Patent
Sahota

(10) Patent No.: US 8,411,788 B2
(45) Date of Patent: Apr. 2, 2013

(54) DIGITAL TRANSMITTERS FOR WIRELESS COMMUNICATION

(75) Inventor: Gurkanwal S Sahota, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 1020 days.

(21) Appl. No.: 11/561,262

(22) Filed: Nov. 17, 2006

(65) Prior Publication Data

US 2007/0160164 A1   Jul. 12, 2007

Related U.S. Application Data

(60) Provisional application No. 60/737,898, filed on Nov. 18, 2005.

(51) Int. Cl.
*H04L 27/00* (2006.01)

(52) U.S. Cl. ........ 375/295; 375/296; 375/297; 375/300; 375/302; 375/376; 455/69; 455/91; 455/108; 455/114.3; 455/260; 327/147; 327/156

(58) Field of Classification Search ........ 375/395, 375/296, 297, 295, 300, 302, 376; 455/91, 455/69, 114.3, 108, 260; 327/147, 156
See application file for complete search history.

(56) References Cited

U.S. PATENT DOCUMENTS

| | | | |
|---|---|---|---|
| 5,493,583 A * | 2/1996 | Cripps | 375/219 |
| 5,534,827 A | 7/1996 | Yamaji | |
| 6,246,351 B1 | 6/2001 | Yilmaz | |
| 6,256,482 B1 | 7/2001 | Raab | |
| 6,734,741 B2 * | 5/2004 | Staszewski et al. | 331/36 C |
| 6,813,319 B1 * | 11/2004 | Nagle et al. | 375/302 |
| 6,975,686 B1 * | 12/2005 | Khatibzadeh et al. | 375/295 |
| 7,346,122 B1 * | 3/2008 | Cao | 375/296 |
| 7,502,422 B2 * | 3/2009 | Dennis et al. | 375/295 |
| 7,532,679 B2 | 5/2009 | Staszewski et al. | |
| 2003/0112063 A1 | 6/2003 | Kenington | |

(Continued)

FOREIGN PATENT DOCUMENTS

| | | |
|---|---|---|
| CN | 1711734 A | 12/2005 |
| GB | 359206 | 10/1931 |

(Continued)

OTHER PUBLICATIONS

International Search Report and Written Opinion—PCT/US06/061124, International Searching Authority, European Patent Office, Mar. 13, 2008.

(Continued)

*Primary Examiner* — Leon Flores
(74) *Attorney, Agent, or Firm* — Howard Seo; Ramin Mobarhan

(57) ABSTRACT

Digital transmitters having improved characteristics are described. In one design of a digital transmitter, a first circuit block receives inphase and quadrature signals, performs conversion from Cartesian to polar coordinates, and generates magnitude and phase signals. A second circuit block (which may include a delta-sigma modulator or a digital filter) generates an envelope signal based on the magnitude signal. A third circuit block generates a phase modulated signal based on the phase signal. The third circuit block may include a phase modulating phase locked loop (PLL), a voltage controlled oscillator (VCO), a saturating buffer, and so on. A fourth circuit block (which may include one or more exclusive-OR gates or an amplifier with multiple gain states) generates a digitally modulated signal based on the envelope signal and the phase modulated signal. A fifth circuit block (which may include a class D amplifier and/or a power amplifier) amplifies the digitally modulated signal and generates an RF output signal.

36 Claims, 11 Drawing Sheets

U.S. PATENT DOCUMENTS

| | | | |
|---|---|---|---|
| 2005/0110565 A1 | 5/2005 | Robinson | |
| 2005/0110568 A1* | 5/2005 | Robinson et al. | 330/151 |
| 2005/0215216 A1* | 9/2005 | Mallinson et al. | 455/222 |
| 2005/0271161 A1* | 12/2005 | Staszewski et al. | 375/308 |
| 2006/0245517 A1 | 11/2006 | Ikedo et al. | |

FOREIGN PATENT DOCUMENTS

| | | |
|---|---|---|
| GB | 2359206 A | 8/2001 |
| JP | 3066232 A | 3/1991 |
| JP | 6021991 A | 1/1994 |
| JP | 07193442 | 7/1995 |
| JP | 2004112077 A | 4/2004 |
| JP | 2004233901 A | 8/2004 |
| JP | 2005117091 A | 4/2005 |
| WO | WO02103912 A1 | 12/2002 |
| WO | WO2004034565 A2 | 4/2004 |
| WO | WO2004034603 | 4/2004 |
| WO | WO2005011109 A1 | 2/2005 |
| WO | WO2005099098 A1 | 10/2005 |
| WO | WO2007106460 | 9/2007 |

OTHER PUBLICATIONS

Bourdopoulos G.I, et al., "Delta-Sigma modulators: modeling, design and applications, Chapter 1, (Introduction)", Sep. 1, 2003, World Scientific Publishing Company, London, XP002630030, ISBN: 1860943691 pp. 1-9.

European Search Report—EP09012581—Search Authority—Berlin—Mar. 25, 2011.

Kroupa, V, "Phase Lock Loops and GFrequency Synthesis", Jan. 1, 2003, John Wiley & Sons Ltd., England, XP002630029, ISBN: 0470848669 pp. 249-252-289-290.

Partial European Search Report—EP09012581—Search Authority—Berlin—Jul. 8, 2010.

Sakurai H., et al., "The Design of a 2.7 V, 200 MS/S, and 14-Bit CMOS D/A Converter With 63 DB of SFDR Characteristics for the 90 MHZ Output Signal, 20030601 Electronics Society, Tokyo, JP—ISSN 0916-8524, XP001172324", IEICE Transactions on Electronics, vol. E86-C, Nr:6, 1077-1084.

Yanghui Huang et al., "Filter considerations in polar transmitters for multi-mode wireless applications", Wireless and Micrwave Technology, 2005. The 2005 IEEE Annual Conference Clearwater, FL, USA Apr. 7-8, 2005, Piscataway, NJ, USA, IEEE, 7 Apri 1 2005 (Apr. 7, 2005), pp. 23-23, XP010849974, DOI: DOI:10.1109/WAMIC.2005. 1528360 ISBN: 978-0-7803-8861-1.

European Search Report—EP10013699—Search Authority—Berlin—Mar. 23, 2012.

European Search Report—EP10013700—Search Authority—Berlin—Mar. 26, 2012.

Hong-Xing et al., "The transfer function design method of high-order Sigma-Delta Modulator", Microelectronics & Computer, Jun. 2004, pp. 147-153.

Huang Y et al., "Filter considerations in polar transmitters for multi-mode wireless applications", Wireless and Micrwave Technology, 2005. The 2005 IEEE Annual Conferenc E Clearwater, FL, USA Apr. 7-8, 2005, Piscataway, NJ, USA, IEEE, Apr. 7, 2005, pp. 133-136, XP010850015, DOI: 10.1109/WAMIC.2005.1528401 ISBN: 978-0-7803-8861-1.

\* cited by examiner

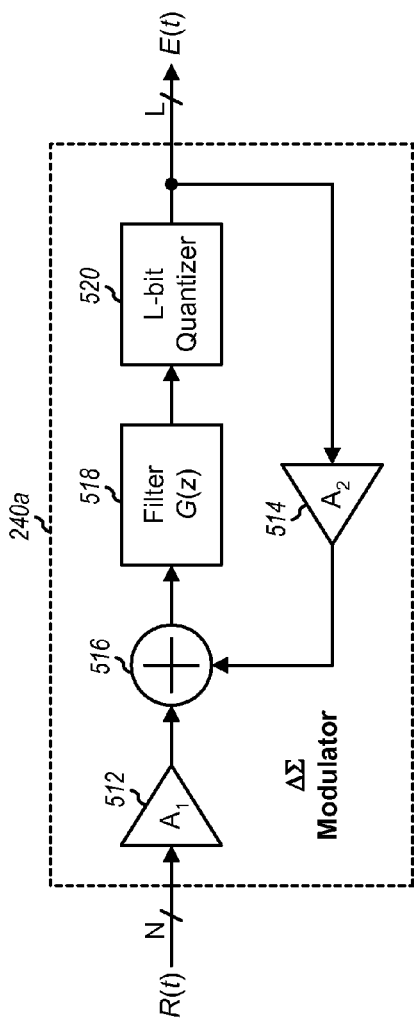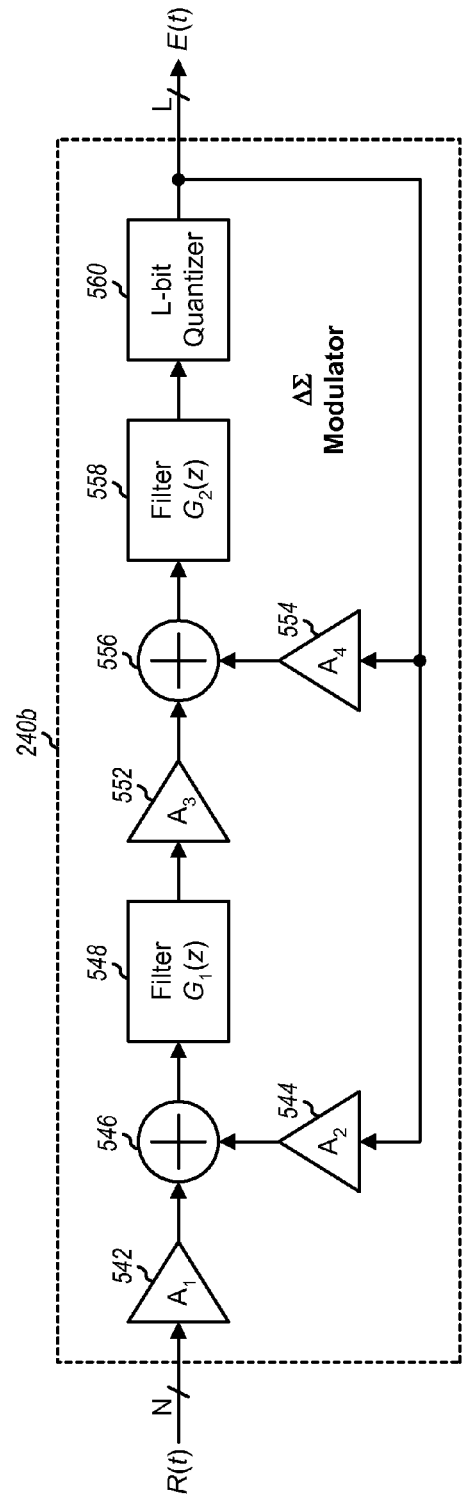

US 8,411,788 B2

DIGITAL TRANSMITTERS FOR WIRELESS COMMUNICATION

The present Application for Patent claims priority to Provisional Application No. 60/737,898 entitled "DIGITAL TRANSMITTER FOR WIRELESS COMMUNICATION" filed Nov. 18, 2005, and assigned to the assignee hereof and hereby expressly incorporated by reference herein.

BACKGROUND

I. Field

The present disclosure relates generally to electronic circuits, and more specifically to a transmitter for wireless communication.

II. Background

In a wireless communication system, a wireless device often digitally processes traffic data to generate data samples. A transmitter within the wireless device typically converts the data samples to analog signals, filters and amplifies the analog signals, and modulates a local oscillator (LO) signal with the amplified analog signals to generate a modulated signal. The transmitter further filters and amplifies the modulated signal to generate a radio frequency (RF) output signal that is suitable for transmission via a wireless channel. The signal conditioning and modulation by the transmitter often require various analog circuit blocks such as filters, amplifiers, mixers, and so on. These analog circuit blocks may be difficult to design and may also be susceptible to performance degradation due to component mismatches and tolerances. Furthermore, these analog circuit blocks may consume large amounts of battery power and may represent a fairly significant portion of the overall cost of the wireless device.

There is therefore a need in the art for a transmitter having improved performance, less power consumption, and/or lower cost.

SUMMARY

Digital transmitters having improved characteristics and suitable for use in various wireless communication systems are described herein. In an embodiment, a digital transmitter includes a first circuit block that receives inphase and quadrature signals, performs conversion from Cartesian to polar coordinates, and generates magnitude and phase signals. The first circuit block may comprise a Coordinate Rotational Digital Computer (CORDIC) processor, a look-up table, or some other circuit. A second circuit block (which may comprise a delta-sigma ($\Sigma\Delta$) modulator or a digital filter) generates an envelope signal based on the magnitude signal. A third circuit block generates a phase modulated signal based on the phase signal. The third circuit block may comprise a phase modulating phase locked loop (PLL), a voltage controlled oscillator (VCO), a saturating buffer, and so on. The phase modulating PLL generates a control signal used to modulate the phase of the VCO. The phase modulating PLL may be implemented with various circuit blocks such as a multi-modulus divider (MMD), a multi-bit phase detector, a loop filter, an interpolator, a $\Sigma\Delta$ digital-to-analog converter ($\Sigma\Delta$ DAC), a $\Sigma\Delta$ modulator, and so on, as described below.

A fourth circuit block (which may comprise one or more exclusive-OR gates or an amplifier with multiple gain states) generates a digitally modulated signal based on the envelope signal and the phase modulated signal. A fifth circuit block (which may comprise a class D amplifier and/or a power amplifier) amplifies the digitally modulated signal and generates an RF output signal. Many of the circuit blocks within the digital transmitter are digital circuits or have digital characteristics and may be more readily fabricated on an integrated circuit.

Various aspects and embodiments of the invention are described in further detail below.

BRIEF DESCRIPTION OF THE DRAWINGS

FIGS. 5A and 5B show diagrams of two $\Sigma\Delta$ modulators.

DETAILED DESCRIPTION

Figure 1:
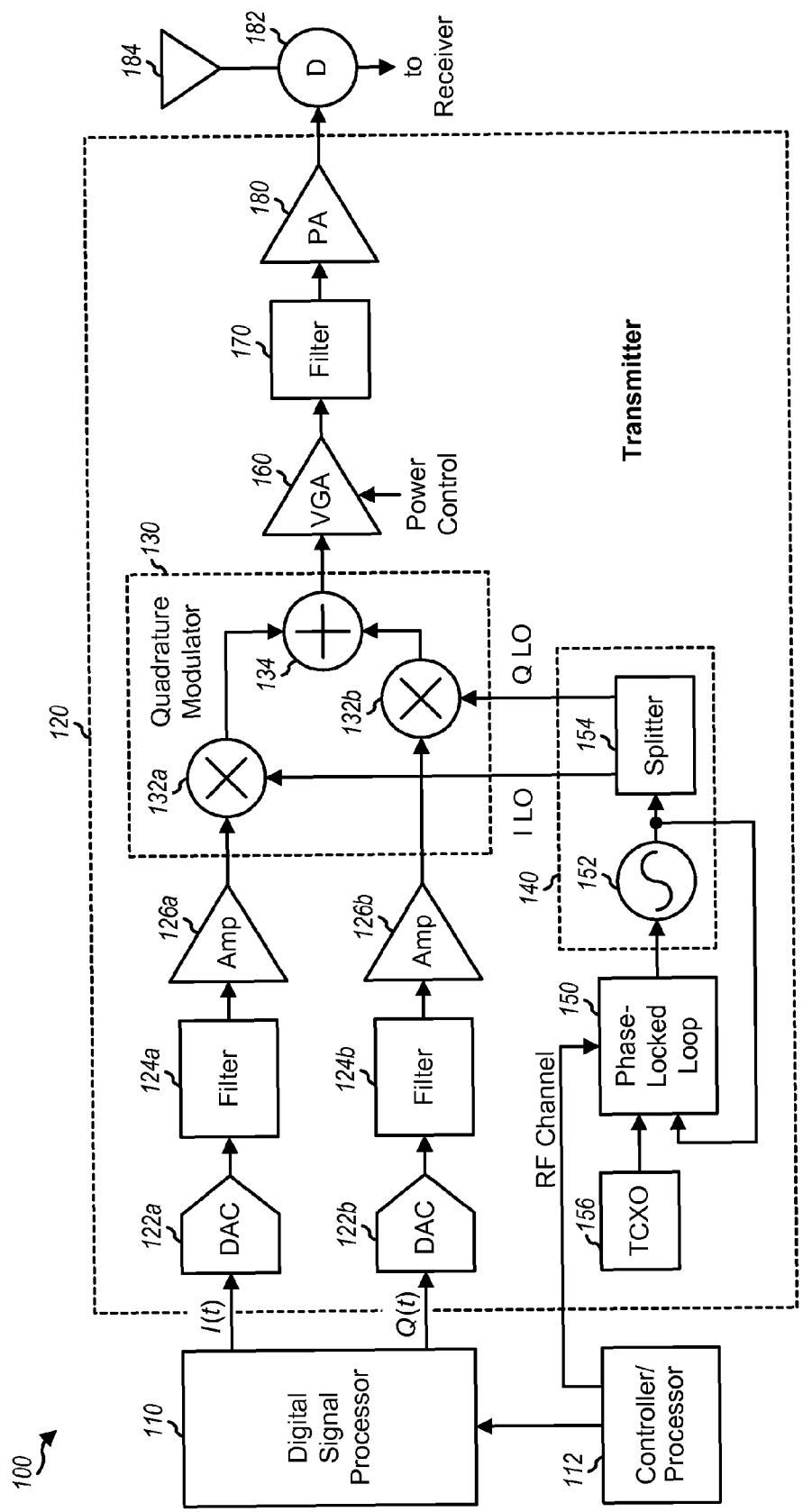
FIG. 1 shows a diagram of a wireless device with an analog transmitter.

FIG. 1 shows a block diagram of a wireless device 100 with an analog transmitter 120. A digital signal processor (DSP) 110 processes traffic data to be transmitted and provides inphase (I) and quadrature (Q) data streams, which are denoted as I(t) and Q(t) signals, respectively, where t denotes sample period. Within transmitter 120, the I data stream is converted to an I analog signal by a DAC 122a, filtered by a filter 124a to remove images caused by the digital-to-analog conversion, and amplified by an amplifier (Amp) 126a to generate an I modulating signal. Similarly, the Q data stream is converted to a Q analog signal by a DAC 122b, filtered by a filter 124b, and amplified by an amplifier 126b to generate a Q modulating signal.

A quadrature modulator 130 receives the I and Q modulating signals from amplifiers 126a and 126b, respectively, and I and Q LO signals from an LO generator 140. The I and Q LO signals are 90 degrees out of phase with each other. Within quadrature modulator 130, a mixer 132a modulates the I LO signal with the I modulating signal, a mixer 132b modulates the Q LO signal with the Q modulating signal, and a summer 134 combines the outputs of mixers 132a and 132b to generate a modulated signal. The modulated signal is then amplified by a variable gain amplifier (VGA) 160, filtered by a bandpass filter 170, and further amplified by a power amplifier (PA) 180 to generate an RF output signal. The RF output signal is routed through a duplexer (D) 182 and transmitted from an antenna 184.

LO generator 140 includes a VCO 152 and a splitter 154. VCO 152 generates an LO signal at a desired RF frequency. Splitter 154 receives the LO signal and generates the I and Q LO signals for mixers 132a and 132b, respectively. Each LO signal is a periodic signal with a desired fundamental frequency. A PLL 150 receives a desired RF channel from a controller/processor 112, a reference signal from a temperature compensated crystal oscillator (TCXO) 156, and the LO signal from VCO 152. PLL 150 generates a control signal that adjusts the frequency and/or phase of VCO 152 such that the RF output signal is centered at the desired RF frequency.

FIG. 1 shows a direct conversion transmitter that performs modulation directly at RF to generate a modulated signal at the desired RF frequency. A super-heterodyne transmitter (not shown in FIG. 1) performs modulation at an intermediate frequency (IF) and then frequency upconverts the IF modulated signal to RF. In general, a transmitter may perform signal conditioning and modulation using one or more stages of amplifier, filter, mixer, and so on.

For the analog transmitter shown in FIG. 1, various analog circuit blocks are used for modulation and signal conditioning. These analog circuit blocks may have undesirable characteristics relating to performance, power, and cost, as noted above.

Figure 2:
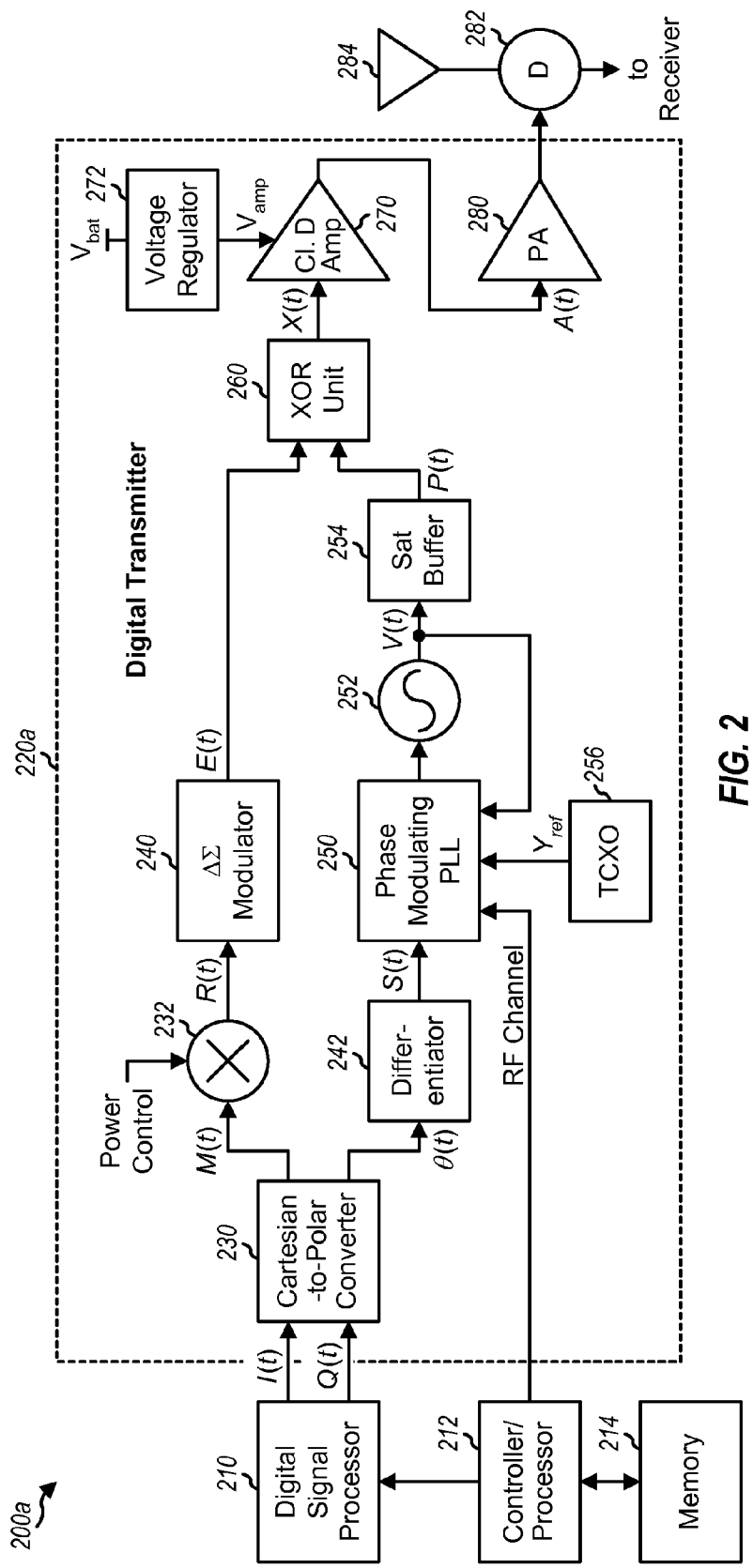
FIG. 2 shows a diagram of a wireless device with a digital transmitter.

FIG. 2 shows a block diagram of a wireless device 200a with a digital transmitter 220a. A DSP 210 processes traffic data to be transmitted and provides I and Q data streams, I(t) and Q(t). Within transmitter 220a, a Cartesian-to-polar converter 230 receives the I and Q data streams, converts the data samples from Cartesian to polar coordinates, and provides a magnitude signal M(t) and a phase signal θ(t). The magnitude signal represents the envelope of the I and Q data streams.

In the magnitude path or magnitude circuit block, a multiplier 232 multiplies the magnitude signal M(t) with a power control value and provides a scaled magnitude signal R(t). A ΣΔ modulator 240 converts the scaled magnitude signal R(t) to an envelope signal E(t) having fewer bits but a higher rate than the scaled magnitude signal. For example, the scaled magnitude signal R(t) may have multiple (N) bits at a sample rate of $f_s$, and the envelope signal E(t) may have a single bit at multiple (K) times the $f_s$ sample rate.

In the phase path or phase circuit block, a differentiator 242 differentiates the phase signal θ(t) and provides a modulating signal S(t), which is related to the frequency component of I(t) and Q(t). Differentiator 242 may implement a difference equation and may generate the modulating signal as S(t)=θ(t)−θ(t−1), where θ(t) and θ(t−1) are phase values for two consecutive sample periods. A phase modulating PLL 250 receives the modulating signal S(t), a VCO signal V(t) from a VCO 252, a reference signal $Y_{ref}$ from a TCXO 256, and the desired RF channel from a controller/processor 212. PLL 250 modulates the phase of VCO 252 based on the S(t) signal such that the VCO signal contains the desired phase modulation. A saturating buffer 254 amplifies and buffers the VCO signal and provides a phase modulated signal P(t) having a constant envelope and zero crossings determined by the modulating signal S(t).

In the output path, an exclusive-OR (XOR) unit 260 multiplies the phase modulated signal P(t) with the envelope signal E(t) and provides a digitally modulated signal X(t). The X(t) signal has a phase that is determined by the S(t) signal and an envelope that is determined by the E(t) signal. A class D amplifier 270 efficiently amplifies the digitally modulated signal and provides an amplified signal A(t). A voltage regulator 272 receives a power supply voltage $V_{bat}$ and generates a supply voltage $V_{amp}$ for class D amplifier 270. A power amplifier 280 amplifies the output of class D amplifier 270 and provides an RF output signal, which is routed through a duplexer 282 and transmitted from an antenna 284.

Controller/processor 212 controls the operation of DSP 210 and other circuit blocks within wireless device 200a. A memory 214 stores data and program codes used by controller/processor 212 and may be implemented external to controller/processor 212 (as shown in FIG. 2) or internal to the controller/processor.

Figure 3:
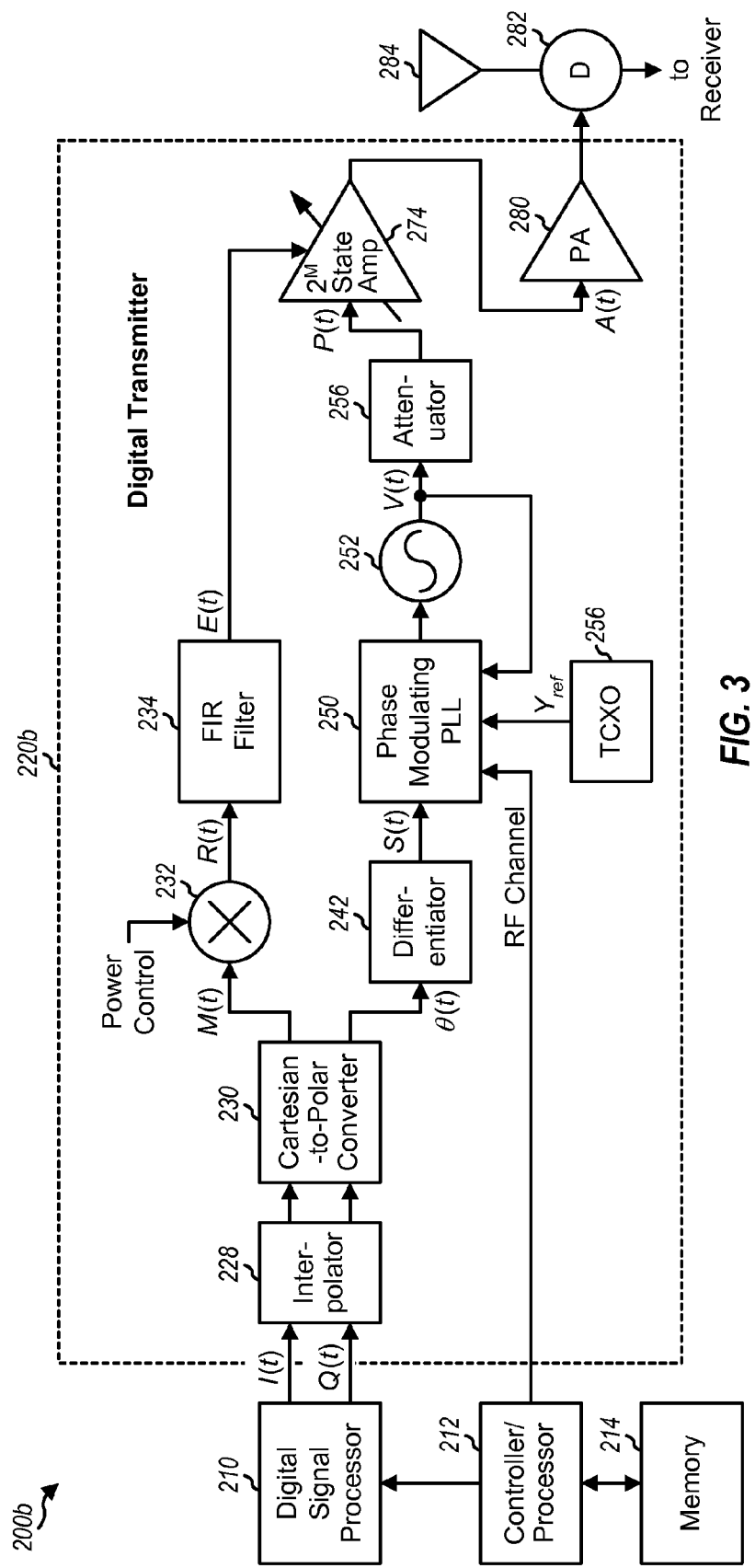
FIG. 3 shows a diagram of a wireless device with another digital transmitter.

FIG. 3 shows a block diagram of a wireless device 200b with a digital transmitter 220b. DSP 210 processes traffic data and provides I and Q data streams, I(t) and Q(t), at the sample rate of $f_s$. Within transmitter 220b, an interpolator 228 upsamples the I and Q samples from the $f_s$ sample rate to a higher rate of $f_h$ and provides I and Q samples at the higher rate. Cartesian-to-polar converter 230 receives and converts the higher rate I and Q samples from Cartesian to polar coordinates and provides the magnitude signal M(t) and the phase signal θ(t).

In the magnitude path, multiplier 232 multiplies the magnitude signal M(t) with a power control value and provides the scaled magnitude signal R(t). A finite impulse response (FIR) filter 234 filters the scaled magnitude signal R(t) and provides the envelope signal E(t) having M bits of resolution, where M may be any value. FIR filter 234 generates the envelope signal E(t) having little out-of-band noise at the receive frequency.

In the phase path, differentiator 242, phase modulating PLL 250, and VCO 252 operate as described above for transmitter 220a in FIG. 2. An attenuator 256 attenuates the VCO signal and provides the phase modulated signal P(t), which has a constant envelope and zero crossings determined by the modulating signal S(t).

In the output path, a multi-state amplifier 274 amplifies the phase modulated signal P(t) with different gains selected by the envelope signal E(t). The desired envelope may be obtained by adjusting the gain of amplifier 274 at the higher rate of $f_h$ with the envelope signal E(t). Power amplifier 280 amplifies the output of amplifier 274 and provides the RF output signal, which is routed through duplexer 282 and transmitted from antenna 284.

Many of the circuit blocks within digital transmitters 220a and 220b (e.g., interpolator 228, Cartesian-to-polar converter 230, multiplier 232, FIR filter 234, ΣΔ modulator 240, differentiator 242, PLL 250, and XOR unit 260) may be implemented as digital circuit blocks. Other circuit blocks within digital transmitters 220a and 220b (e.g., saturating buffer 254, attenuator 256, class D amplifier 270, and multi-state amplifier 274) are digital in nature. Hence, DSP 210, controller/processor 212, memory 214, and much of digital transmitters 220a and 220b (possibly except for VCO 252 and TCXO 256) may be implemented within an application specific integrated circuit (ASIC) to reduce cost and improve reliability. The digital nature of these circuit blocks may also result in improved performance, reduced power consumption, and/or lower cost over analog transmitter 120 in FIG. 1. The key circuit blocks within digital transmitters 220a and 220b are described in further detail below.

Cartesian-to-polar converter 230 may be implemented in various manners. In an embodiment, Cartesian-to-polar converter 230 is a look-up table that receives I and Q data samples for each sample period and provides the magnitude and phase of these data samples. The look-up table may be implemented with a sufficient number of bits to achieve the desired resolution for the input and output quantities.

In another embodiment, Cartesian-to-polar converter 230 is implemented with a CORDIC processor. The CORDIC processor implements an iterative algorithm that allows for fast hardware calculation of trigonometric functions such as magnitude and phase using simple shift and add/subtract hardware. A complex number D may be rotated by up to 90 degrees by multiplying D=I+jQ with a complex number $C_k$ having the following form: $C_k=1\pm jB_k$, where $B_k=2^{-k}$ and k is an index defined as k=0, 1, 2, . . . . D may be rotated counter-clockwise if $C_k=1+jB_k$, and the rotated result may be expressed as:

$$Y_{re}=I-B_k\cdot Q=I-2^{-k}\cdot Q, \text{ and} \qquad \text{Eq(1a)}$$

$$Y_{im}=Q+B_k\cdot I=Q+2^{-k}\cdot I. \qquad \text{Eq(1b)}$$

D may be rotated clockwise if $C_k=1-jB_k$, and the rotated result may be expressed as:

$$Y_{re}=I+B_k\cdot Q=I+2^{-k}\cdot Q \text{ and} \qquad \text{Eq(2a)}$$

$$Y_{im}=Q-B_k\cdot I=Q-2^{-k}\cdot I. \qquad \text{Eq(2b)}$$

The counter-clockwise rotation of D in equation set (1) and the clockwise rotation of D in equation set (2) via multiplication with $C_k$ may be achieved by (a) shifting both I and Q by k bit positions, (b) adding/subtracting the shifted Q to/from I to obtain $Y_{re}$, and (c) adding/subtracting the shifted I to/from Q to obtain $Y_{im}$. No multiplies are needed to perform the rotation. The phase of $C_k$ is $\theta_k = \angle C_k = -\arctan(B_k)$. For each value of k, $\theta_k$ is slightly more than half of $\theta_{k-1}$.

The magnitude and phase of D may be determined by iteratively rotating D counter-clockwise and/or clockwise with successively smaller phases until the phase of the rotated D approaches zero and the rotated D lies mostly on the x-axis. A phase variable $\theta_{total}$ is initialized to zero, and a variable $D_k=I_k+jQ_k$ representing the rotated D is initialized as $D_0=D$. For each iteration starting with k=0, $D_k$ is deemed to have (1) a positive phase if $Q_k$ is positive or (2) a negative phase if $Q_k$ is negative. If the phase of $D_k$ is negative, then $D_k$ is rotated counter-clockwise by $\theta_k$ by multiplying $D_k$ with $C_k=1+jB_k$, as shown in equation set (1). Conversely, if the phase of $D_k$ is positive, then $D_k$ is rotated clockwise by $\theta_k$ by multiplying $D_k$ with $C_k=1-jB_k$, as shown in equation set (2). $\theta_{total}$ is updated by $+\theta_k$ if $D_k$ is rotated counter-clockwise and by $-\theta_k$ if $D_k$ is rotated clockwise. $\theta_{total}$ represents the cumulative phase that has been added to or subtracted from the phase of D to zero out the phase of $D_k$.

The final result becomes more accurate as more iterations are performed. After all of the iterations are completed, the phase of $D_k$ should be close to zero, the imaginary part of $D_k$ should be approximately zero, and the real part of $D_k$ is equal to the magnitude of D scaled by a CORDIC gain. The CORDIC gain is equal to 1.1412 for k=0 and asymptotically approaches 1.646743507 for larger values of k. The final value of $\theta_{total}$ is the total phase rotation to zero out the phase of $D_k$. $\theta_{total}$ may be represented by a sequence of sign bits, $z_1 z_2 z_3 \ldots$, where $z_k=1$ if $\theta_k$ was subtracted from $\theta_{total}$ and $z_k=-1$ if $\theta_k$ was added to $\theta_{total}$.

The computation of the magnitude and phase of D=I+jQ may be performed as follows. First the variables are initialized as: k=0, $I_0=I$, $Q_0=Q$, and $\theta_{total}(k)=0$. A single iteration of the CORDIC computation may be expressed as:

$$z_k = \text{sign}(Q_k) = \begin{cases} 1 & \text{if } Q_k \geq 0 \\ -1 & \text{if } Q_k < 0 \end{cases} \qquad \text{Eq (3a)}$$

$$I_{k+1} = I_k + z_k \cdot 2^{-k} \cdot Q_k, \qquad \text{Eq (3b)}$$

$$Q_{k+1} = Q_k - z_k \cdot 2^{-k} \cdot I_k, \qquad \text{Eq (3c)}$$

$$\theta_k = \arctan(2^{-k}), \qquad \text{Eq (3d)}$$

$$\theta_{total}(k+1) = \theta_{total}(k) - z_k \cdot \theta_k, \text{ and} \qquad \text{Eq (3e)}$$

$$k = k+1. \qquad \text{Eq (3f)}$$

In equations (3b) and (3c), a counter-clockwise rotation is performed if the phase of $I_k+jQ_k$ is positive and $z_k=1$, and a clockwise rotation is performed if the phase of $I_k+jQ_k$ is negative and $z_k=-1$. After all of the iterations are completed, the magnitude is set as $M=I_{k+1}$ and the phase is set as $\theta=\theta_{total}(k+1)$. The scaling by the CORDIC gain may be accounted for by other circuit blocks.

Figure 4:
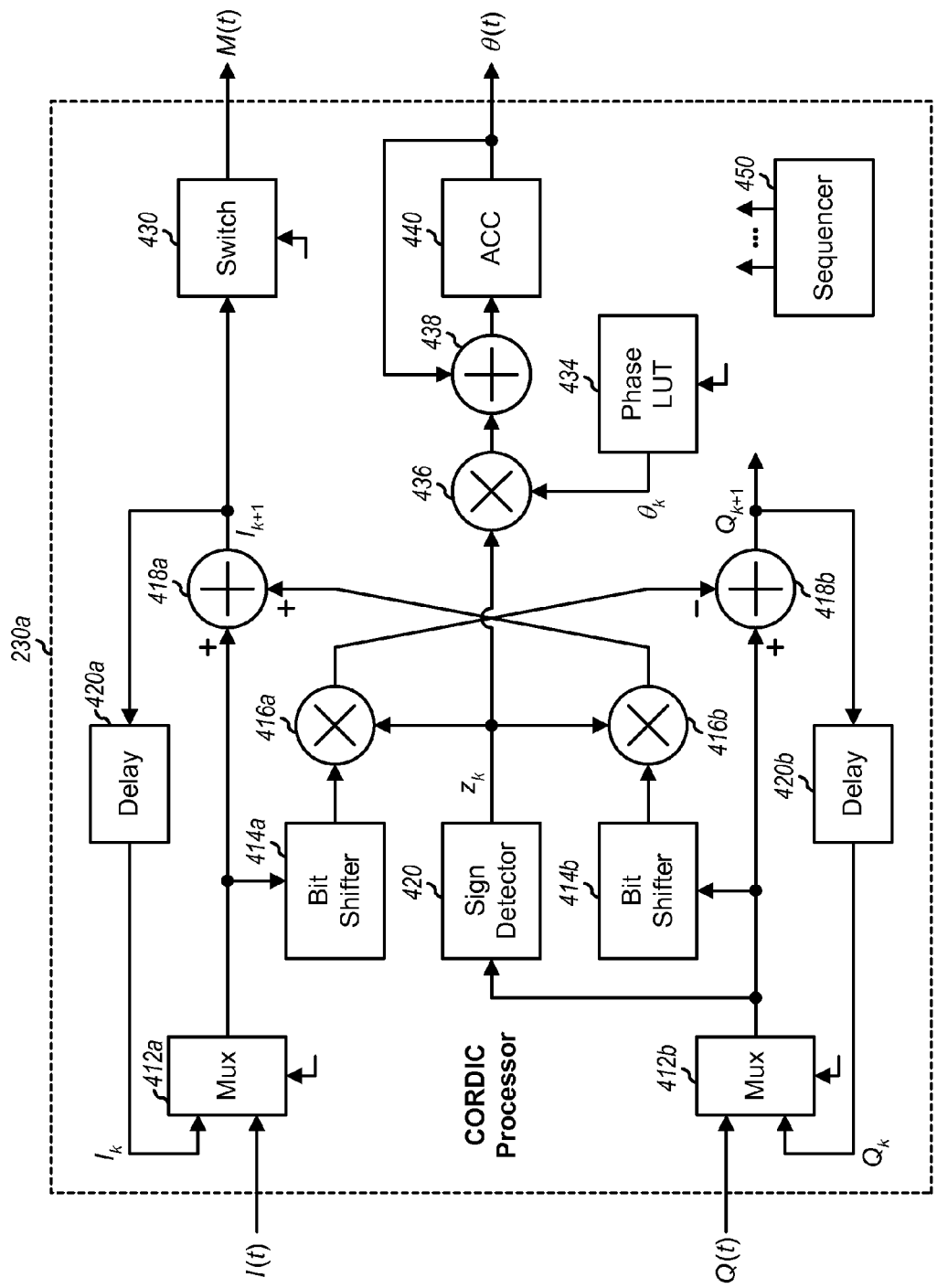
FIG. 4 shows a diagram of a CORDIC processor.

FIG. 4 shows a block diagram of a CORDIC processor 230a, which is an embodiment of Cartesian-to-polar converter 230 in FIGS. 2 and 3. CORDIC processor 230a determines the magnitude M(t) and the phase θ(t) of each pair of data samples I(t) and Q(t) for sample period t. For each pair of data samples, a phase accumulator (ACC) 440 is initialized to zero, and a sequencer 450 steps through index k and provides appropriate controls for the units within CORDIC processor 230a.

A multiplexer (Mux) 412a receives data sample I(t) on a first input and $I_k$ from a delay element 420a on a second input, provides I(t) on its output when k=0, and provides $I_k$ on its output when k>0. The output of multiplexer 412a is $I_k$ for the current iteration. A bit shifter 414a shifts $I_k$ to the left by k bits and provides a shifted $I_k$. A multiplexer 412b receives data sample Q(t) on a first input and $Q_k$ from a delay element 420b on a second input, provides Q(t) on its output when k=0, and provides $Q_k$ on its output when k>0. The output of multiplexer 412b is $Q_k$ for the current iteration. A bit shifter 414b shifts $Q_k$ to the left by k bits and provides a shifted $Q_k$.

A sign detector 420 detects the sign of $Q_k$ and provides the sign bit $z_k$, as shown in equation (3a). A multiplier 416a multiplies the shifted $I_k$ with the sign bit $z_k$. A multiplier 416b multiplies the shifted $Q_k$ with the sign bit $z_k$. A summer 418a sums the output of multiplier 416b with $I_k$ and provides $I_{k+1}$ for the current iteration, which is also $I_k$ for the next iteration. A summer 418b subtracts the output of multiplier 416a from $Q_k$ and provides $Q_{k+1}$ for the current iteration, which is also $Q_k$ for the next iteration. Delay elements 420a and 420b receive the outputs of summers 418a and 418b, respectively.

A phase look-up table 434 provides the phase $\theta_k$ for the current iteration. A multiplier 436 multiplies the phase $\theta_k$ with the sign bit $z_k$. A summer 438 sums the output of multiplier 436 with the output of accumulator 440, as shown in equation (3e), and provides the accumulated phase to accumulator 440. After all of the iterations are completed, a switch 430 provides $I_{k+1}$ as the magnitude M(t), and accumulator 440 provides the stored value as the phase θ(t) for the I(t) and Q(t) sample pair.

FIG. 5A shows a block diagram of a ΣΔ modulator 240a, which is an embodiment of ΣΔ modulator 240 in FIG. 2. ΣΔ modulator 240a receives an N-bit R(t) signal at the sample rate of $f_s$ and provides an L-bit E(t) signal at multiple (K) times the sample rate, where in general N>1, N>L≧1, and K>1. K is the oversampling ratio and may be equal to 4, 8, 16, 32, or some other value. L is the number of bits for the E(t) signal and may be equal to 1, 2, or some other number of bits.

Within ΣΔ modulator 240a, the R(t) signal is scaled with a gain of $A_1$ by a scaling unit 512, and the E(t) signal is scaled with a gain of $A_2$ by a scaling unit 514. A summer 516 sums the outputs of scaling units 512 and 514. A filter section 518 filters the output of summer 516 with a transfer function of G(z). An L-bit quantizer 520 quantizes the output of filter section 518 and provides an L-bit output as the E(t) signal. The units within ΣΔ modulator 240a are operated at K times the sample rate and provide K output values for the E(t) signal for each input value for the R(t) signal. The filter transfer function G(z) and the gains $A_1$ and $A_2$ determine the overall transfer function for ΣΔ modulator 240a. For example, ΣΔ modulator 240a may be a first-order ΣΔ modulator if G(z)=1/

(z+1) and may be a second-order ΣΔ modulator if G(z)=1/(z²+1), where z denotes a delay of 1/K sample period.

FIG. 5B shows a block diagram of a ΣΔ modulator 240b, which is another embodiment of ΣΔ modulator 240 in FIG. 2. Within ΣΔ modulator 240b, the R(t) signal is scaled with a gain of $A_1$ by a scaling unit 542, and the E(t) signal is scaled with gains of $A_2$ and $A_4$ by scaling units 544 and 554, respectively. A summer 546 sums the outputs of scaling units 542 and 544. A filter section 548 filters the output of summer 546 with a transfer function of $G_1(z)$. A scaling unit 552 scales the output of filter section 548 with a gain of $A_3$. A summer 556 sums the outputs of scaling units 552 and 554. A filter section 558 filters the output of summer 556 with a transfer function of $G_2(z)$. An L-bit quantizer 560 quantizes the output of filter section 558 and provides an L-bit output as the E(t) signal. The filter transfer functions $G_1(z)$ and $G_2(z)$ and the gains $A_1$ through $A_4$ determine the overall transfer function for ΣΔ modulator 240b. For example, ΣΔ modulator 240b may be a second-order ΣΔ modulator if $G_1(z)=G_2(z)=1/(z+1)$ or a fourth-order ΣΔ modulator if $G_1(z)=G_2(z)=1/(z^2+1)$.

FIGS. 5A and 5B show two embodiments of ΣΔ modulator 240. In general, ΣΔ modulator 240 may be implemented with any architecture, any number of stages, any order, any number of output bits L, and any oversampling ratio K. Complexity increases and stability is more problematic for more stages, higher order, and larger values of L.

Although not shown in FIGS. 1 and 2 for simplicity, the transmitter and receiver within a wireless device may both be active at the same time to support full-duplex communication with a base station. The RF output signal level from the transmitter may be very large, and the RF input signal level for the receiver may be very small if the path loss between the wireless device and the base station is large. The noise transfer function of ΣΔ modulator 240 may be designed such that noise feed-through from the transmitter to the receiver is reduced as much as possible.

Figure 5C:
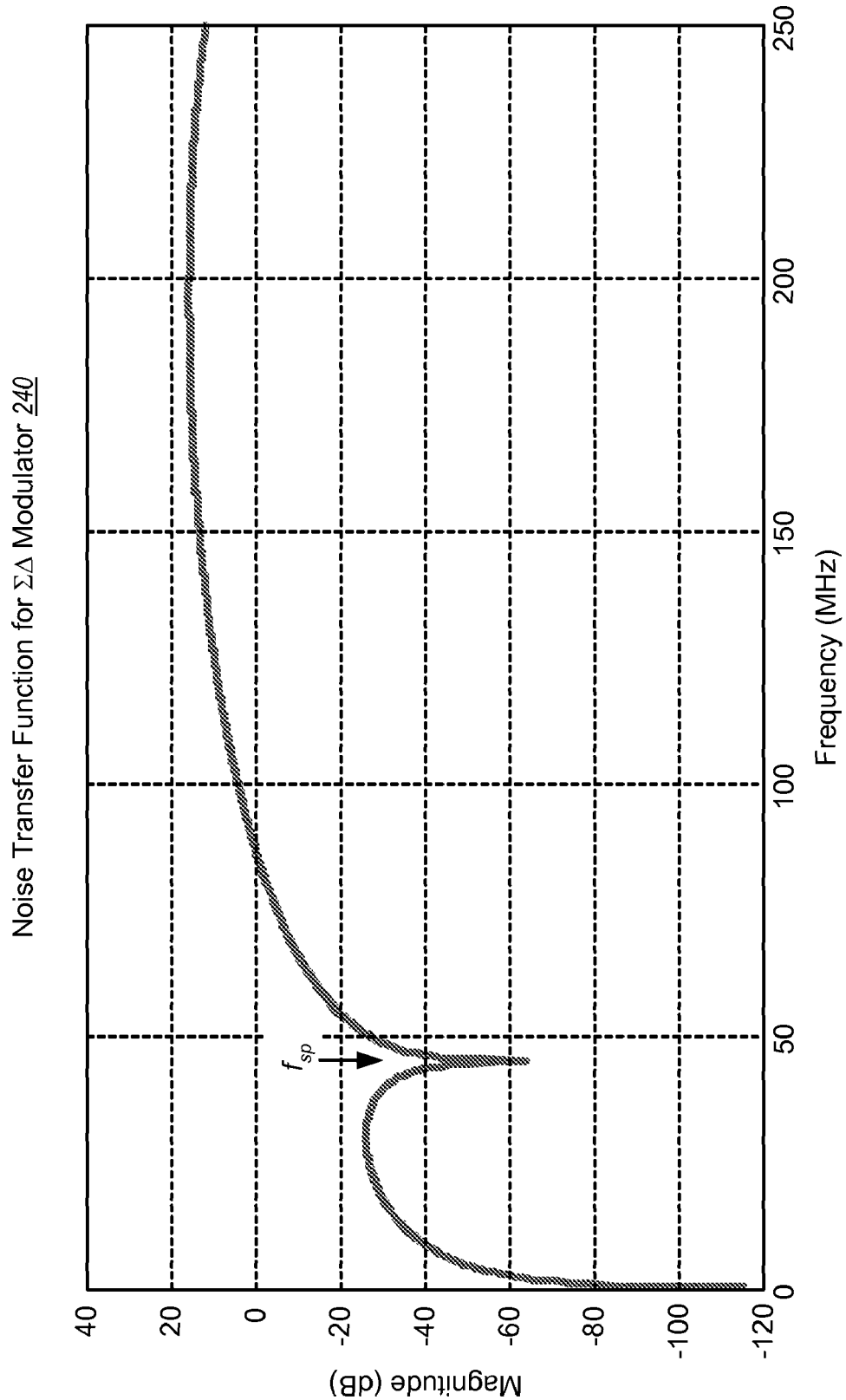
FIG. 5C shows a noise transfer function for a $\Sigma\Delta$ modulator.

FIG. 5C shows an example noise transfer function for ΣΔ modulator 240 in the envelope path of digital transmitter 220a. For this embodiment, one or more zeros are placed at DC, and one or more zeros are placed at a frequency of $f_{sp}$, which is the spacing between the transmit and receive frequency bands. $f_{sp}$ is also called the duplex spacing and is equal to 45 MHz for the cellular band and 80 MHz for the PCS band. The zero(s) at frequency $f_{sp}$ attenuate the quantization noise from ΣΔ modulator 240 at this frequency, so that the receiver observes a small amount of noise feed-through from the transmitter.

In general, various noise transfer functions may be used for ΣΔ modulator 240 to achieve the desired noise shaping for the E(t) signal while reducing noise feed-through to the receiver. For example, if ΣΔ modulator 240 has a low order (e.g., second order) and/or few output bits (e.g., L=1), then one or more zeros may be placed at the duplex spacing of $f_{sp}$. Conversely, if ΣΔ modulator 240 has a high order (e.g., fourth order) and/or more output bits (e.g., L=2 or 3), then sufficient attenuation of the noise feed-through may be achieved by placing the zeros at DC, which may improve stability. The noise transfer function may also be programmable, e.g., for different frequency bands, different communication standards, different operating environments, and so on.

Figure 6A:
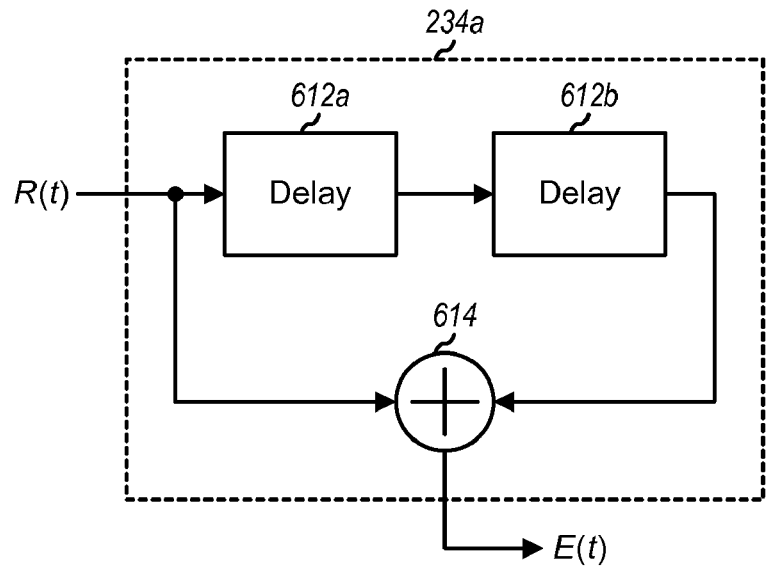
FIGS. 6A and 6B show a diagram of a FIR filter and its response, respectively.

FIG. 6A shows a block diagram of a FIR filter 234a, which is an embodiment of FIR filter 234 in FIG. 3. FIR filter 234a may be used for cellular band where the transmit and receive frequencies are separated by 45 MHz. FIR filter 234a includes delay elements 612a and 612b coupled in series. Each delay element 612 provides one clock cycle of delay at the higher rate $f_h$. The input of delay element 612a receives the scaled magnitude signal R(t). A summer 614 receives the input of delay element 612a and the output of delay element 612b, sums the two input signals, and provides the envelope signal E(t). FIR filter 234a has the following transfer function:

$$H_c(z)=1+Z^{-2}. \quad\quad\quad \text{Eq (4)}$$

Figure 6B:
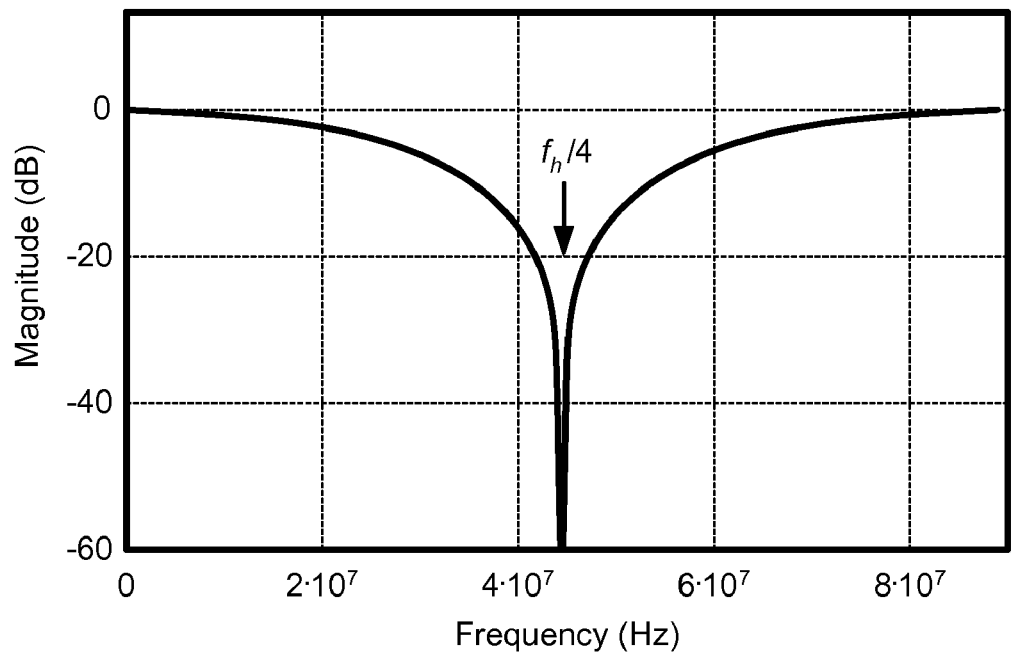

FIG. 6B shows the transfer function $H_c(z)$ of FIR filter 234a, which has a notch at $f_h/4$. The sample rate $f_s$ may be four or eight times the chip rate $f_c$, which is 1.2288 Mcps for cdma2000. The higher rate $f_h$ may be 16×9=144 times the chip rate, or $f_h$=176.94 MHz. The notch would then be located at 44.23 MHz. The location of the notch is determined by the frequency response of FIR filter 234a and may be varied by adjusting the higher rate $f_h$.

In an embodiment, for PCS band, a transfer function of $H_p(z)=1+Z^{-1}$ is used for FIR filter 234, and the same higher rate of $f_h$=176.94 MHz is also used. This combination provides a notch at $f_h/2$=88.47 MHz.

The transfer functions described above simplify the implementation of FIR filter 234. Other transfer functions may also be used to achieve the desire out-of-band attenuation for the envelope signal E(t). In an embodiment, noise shaping is not performed on the envelope signal E(t), which is provided directly to amplifier 274. Amplifier 274 includes a DAC for the envelope signal E(t), and additional filtering is provided by the zero order hold nature of the DAC.

Figure 7:
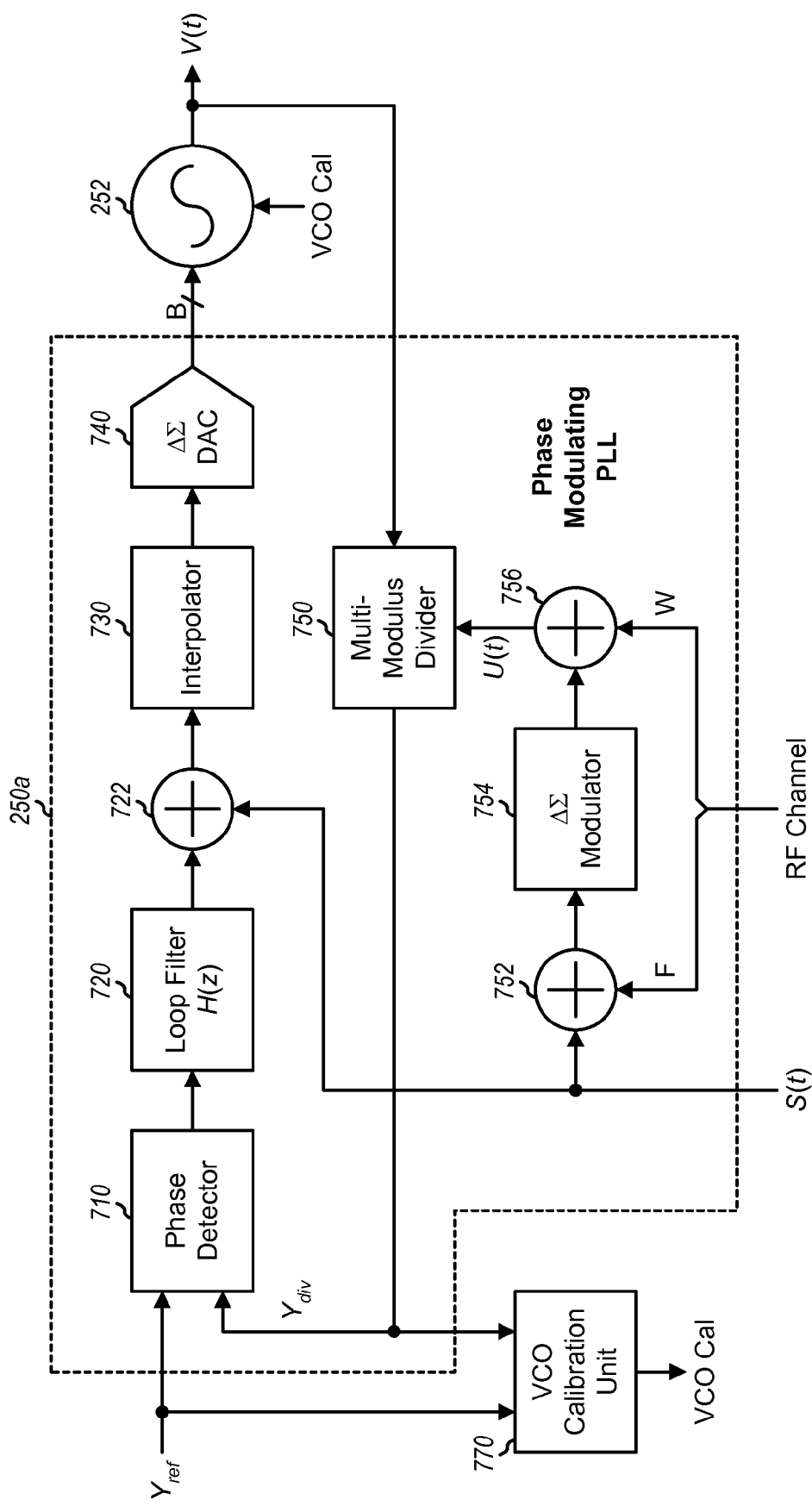
FIG. 7 shows a diagram of a phase modulating PLL.

FIG. 7 shows a block diagram of a dual-port phase modulating PLL 250a, which is an embodiment of PLL 250 in FIGS. 2 and 3. For this embodiment, a multi-modulus divider (MMD) 750 receives the VCO signal V(t) from VCO 252, divides the VCO signal in frequency by a factor of U(t), and provides a divided VCO signal $Y_{div}$. The divider ratio U(t) is determined by the frequency $f_{ch}$ of the desired RF channel, the frequency $f_{ref}$ of the reference signal $Y_{ref}$ and the modulating signal S(t), or $U(t)=f_{ch}/f_{ref}+S(t)$.

A phase detector 710 receives the reference signal $Y_{ref}$ and the divided VCO signal $Y_{div}$, compares the phases of the two signals, and provides a detector output signal that is proportional to the detected phase difference/error between the two signals. A loop filter 720 filters the detector output signal with a transfer function of H(z) and provides a loop filter output signal. Loop filter 720 filters out quantization noise and also sets the loop dynamics. A summer 722 sums the loop filter output signal and the S(t) signal. An interpolator 730 performs interpolation on the output of summer 722 and provides an interpolated signal having a higher rate and higher resolution. A ΣΔ DAC 740 converts the interpolated signal to a VCO control signal having B bits of resolution, where B≧1. The VCO control signal adjusts the phase of VCO 252 such that the phase of the divided VCO signal is locked to the phase of the reference signal.

The ratio of the desired RF channel frequency to the reference signal frequency may be given in terms of an integer portion W and a fractional portion F, or $f_{ch}/f_{ref}=W+F/2^Q$, where Q is the number of bits for a ΣΔ modulator 754. A summer 752 sums the S(t) signal with the fractional portion F. ΣΔ modulator 754 receives the output of summer 752 and provides an output having fewer bits but a higher rate. A summer 756 sums the output of ΣΔ modulator 754 with the integer portion W and provides the divider ratio U(t) to multi-modulus divider 750. Divider 750 includes a high-speed counter that increments by one for each cycle of the VCO signal. Whenever the high-speed counter reaches U(t), divider 750 generates a pulse on the divided VCO signal and resets the counter to zero.

For dual-port phase modulating PLL 250a, low pass modulation is applied via ΣΔ modulator 754, and high pass modulation is applied via summer 722 after loop filter 720. The bandwidth of the I(t) and Q(t) data streams is determined by the system and is approximately 620 KHz for cdma2000. The signal bandwidth is expanded by the Cartesian-to-polar conversion. The bandwidth of PLL 250a is determined by loop filter 720 and is typically limited (e.g., to approximately 80 KHz) to achieve the desired noise filtering and loop dynamics. By applying high pass and low pass modulation via separate paths, PLL 250a can modulate VCO 252 with a wider signal bandwidth than the bandwidth of the PLL. The transfer functions of loop filter 720 and ΣΔ modulator 754 are designed to provide the desired overall response for the S(t) signal.

For PLL 250a, ΣΔ modulator 754 may be implemented with ΣΔ modulator 240a in FIG. 5A, ΣΔ modulator 240b in FIG. 5B, or some other ΣΔ modulator design. ΣΔ DAC 740 may be implemented with ΣΔ modulator 240a albeit with quantizer 520 replaced with a DAC, ΣΔ modulator 240b with quantizer 560 replaced with a DAC, or some other ΣΔ DAC design.

FIG. 7 shows a specific embodiment of a phase modulating PLL, which may also be implemented with other designs. For example, interpolator 730 may be omitted, ΣΔ DAC 740 may be a ΣΔ modulator that provides a B-bit digital control to VCO 252, the modulation may be performed via a single port, and so on.

FIG. 7 also shows a VCO calibration unit 770 used to calibrate VCO 252. VCO calibration unit 770 receives the reference signal and the divided VCO signal and provides a VCO calibration control (VCO Cal) for VCO 252. The VCO Cal control adjusts the operation of VCO 252 to account for integrated circuit (IC) process variations, temperature variations, and/or power supply variations. For example, the VCO Cal control may switch on an appropriate number of tuning capacitors within VCO 252 so that the desired VCO frequency is obtained with a mid-scale value for the VCO control from ΣΔ DAC 740.

Figure 8:
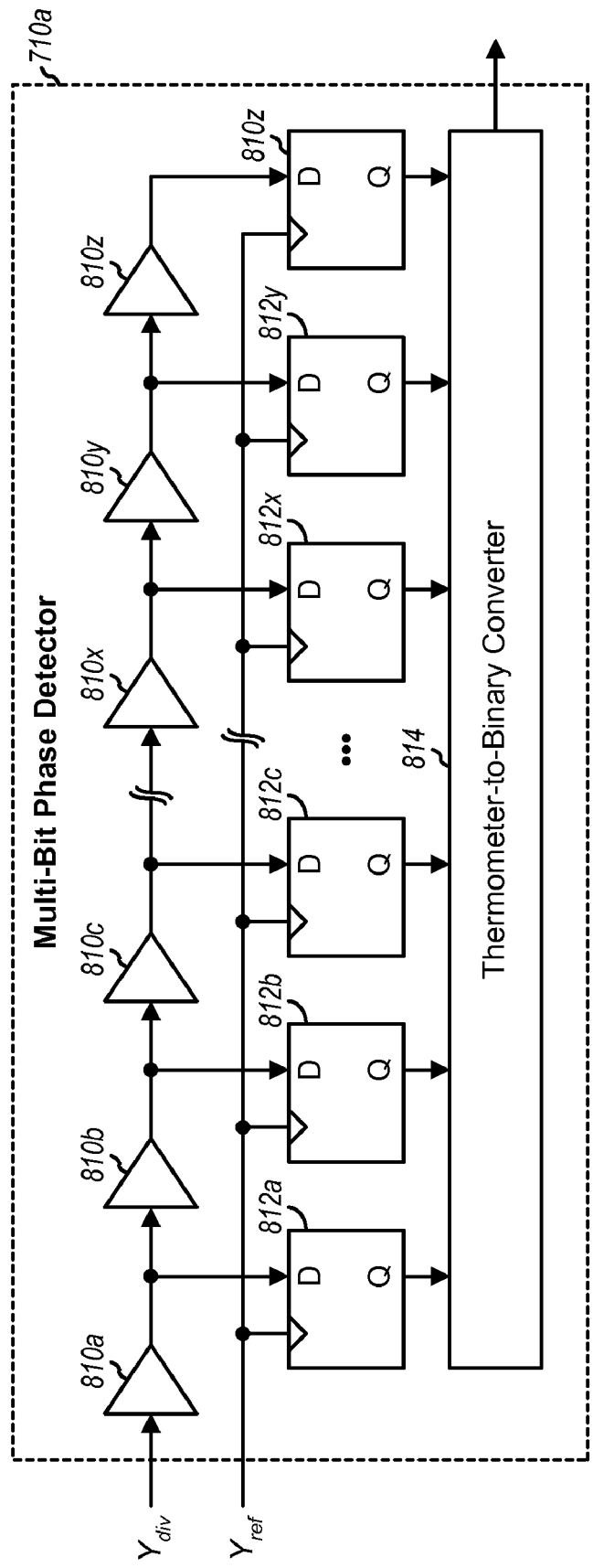
FIG. 8 shows a diagram of a multi-bit phase detector.

FIG. 8 shows a block diagram of a multi-bit phase detector 710a, which is an embodiment of phase detector 710 in FIG. 7. For this embodiment, phase detector 710a compares the phase of the reference signal $Y_{ref}$ against the phase of the divided VCO signal $Y_{div}$ and provides the detected phase difference with multiple (Z) bits of resolution.

Phase detector 710a includes $2^Z$ delay elements 810a through 810z, $2^Z$ D flip-flops 812a through 812z, and a thermometer-to-binary converter 814. Delay elements 810a through 810z are coupled in series, with delay element 810a receiving the divided VCO signal $Y_{div}$. Delay elements 810a through 810z provide a total delay that is approximately equal to the time resolution of the divided VCO signal. For example, if multi-modulus divider 750 is operated at the VCO frequency as shown in FIG. 7, then the divided VCO signal has a time resolution of one VCO cycle. If VCO 252 has a frequency of approximately 4 GHz, then one VCO cycle is approximately 250 picoseconds (ps), and each delay element 810 provides a delay of approximately $250/2^Z$ ps.

D flip-flops 812a through 812z have their D inputs coupled to the outputs of delay elements 810a through 810z, respectively, and their clock inputs receiving the reference signal $Y_{ref}$. Each D flip-flop 812 samples the output signal from a respective delay element 810 and provides the sampled output to converter 814. If the divided VCO signal is phase-locked to the reference signal, then approximately half of D flip-flops 812 will output logic high and the remaining D flip-flops will output logic low for each cycle of the reference signal. The number of D flip-flops at logic high versus the number of D flip-flops at logic low is indicative of the phase error between the reference signal and the divided VCO signal. This phase error has a resolution of $\frac{1}{2}^Z$ VCO cycle. Converter 814 receives the $2^Z$ outputs from D flip-flops 812a through 812z, converts these $2^Z$ outputs to a Z-bit binary value, and provides the Z-bit binary value as the detected phase error between the $Y_{ref}$ and $Y_{div}$ signals.

In general, phase detector 710 may be designed with any number of bits of resolution. For example, Z may be 8 or more depending on the desired resolution, which may in turn be dependent on the system for which the digital transmitter is used.

Figure 9A:
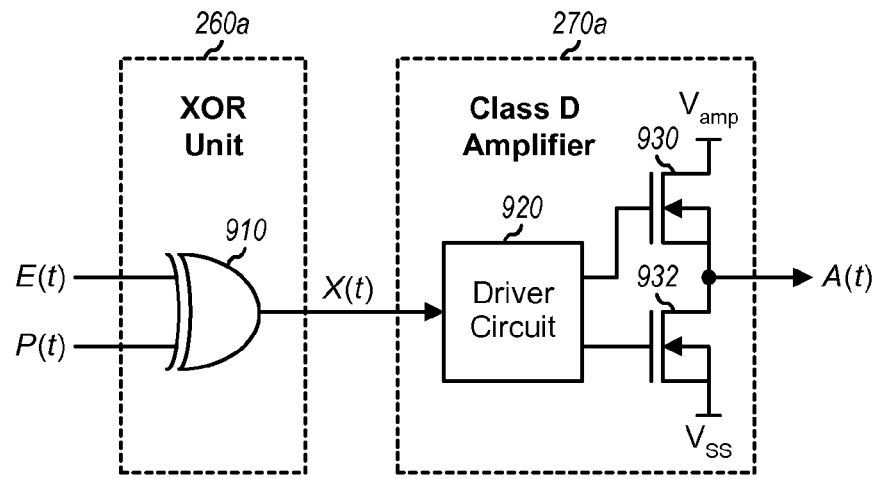
FIG. 9A shows a diagram of a 1-bit XOR unit and a 1-bit class D amplifier.

FIG. 9A shows a block diagram of a 1-bit XOR unit 260a and a 1-bit class D amplifier 270a, which are one embodiment of XOR unit 260 and class D amplifier 270, respectively, in FIG. 2. For this embodiment, XOR unit 260a is composed of a single XOR gate 910 that receives a 1-bit envelope signal E(t) and a 1-bit phase modulated signal P(t). XOR gate 910 performs exclusive-OR on the two input signals and provides a 1-bit digitally modulated signal X(t). The phase modulated signal P(t) has a constant envelope and zero crossings determined by the phase signal θ(t). The envelope signal E(t) contains a sequence of zeros and ones that represents the output signal level, where a higher percentage of ones corresponds to a larger output signal level and a higher percentage of zeros corresponds to a smaller output signal level. The digitally modulated signal X(t) has zero crossings determined by the phase modulated signal P(t) and logic values determined by the envelope signal E(t).

Class D amplifier 270a includes a driver circuit 920 and metal oxide semiconductor field effect transistors (MOSFETs) 930 and 932. Driver circuit 920 receives the 1-bit digitally modulated signal X(t) and provides two control signals for MOSFETs 930 and 932. MOSFET 930 has a drain coupled to the $V_{amp}$ supply voltage, a gate receiving the first control signal from driver circuit 920, and a source coupled to the drain of MOSFET 932 and further driving the amplified signal A(t). MOSFET 932 has a drain driving the amplified signal A(t), a gate receiving the second control signal from driver circuit 920, and a source coupled to the circuit ground $V_{SS}$.

Class D amplifier 270a efficiently toggles between the On and Off states. In the On state, MOSFET 930 is turned on and drives the A(t) signal, and MOSFET 932 is turned off. In the Off state, MOSFET 932 is turned on and sinks current via the A(t) signal, and MOSFET 930 is turned off. Driver circuit 920 generates the two control signals such that (1) only one MOSFET is turned on at any given moment and (2) the on-to-off transition by one MOSFET is approximately aligned in time with the off-to-on transition by the other MOSFET.

Figure 9B:
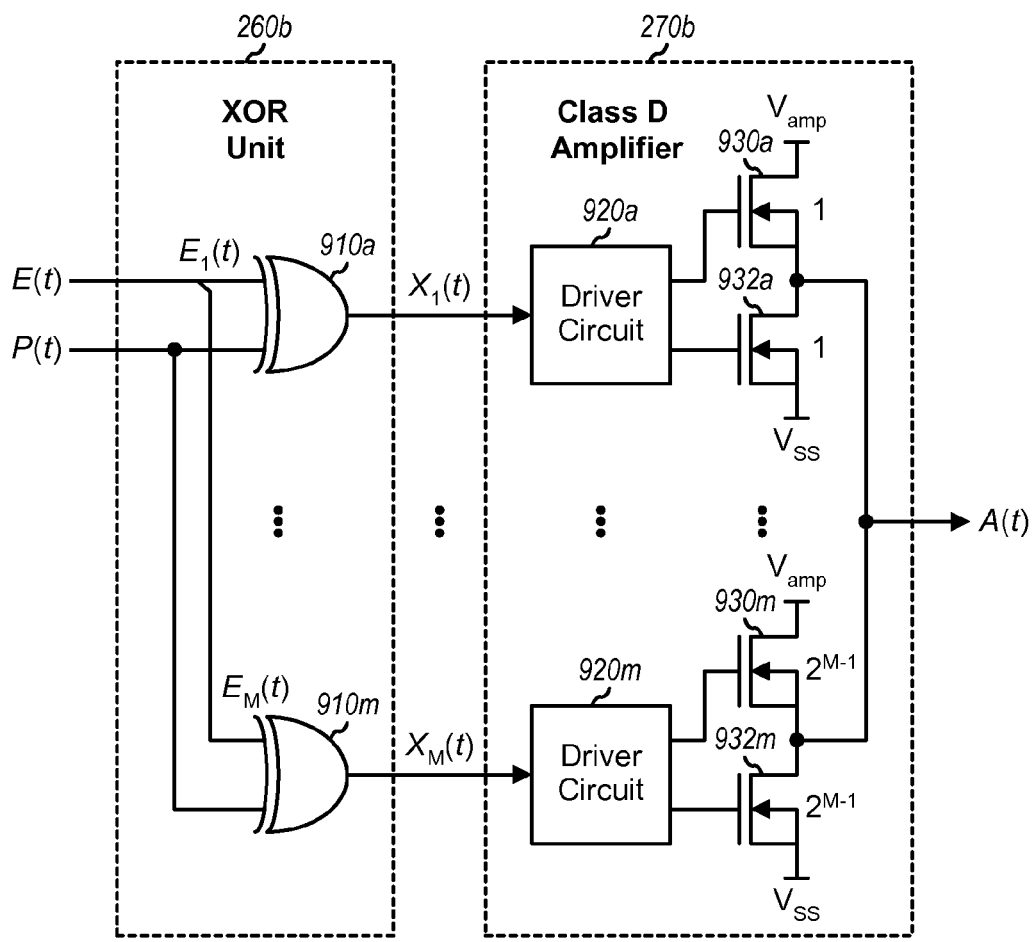
FIG. 9B shows a diagram of a multi-bit XOR unit and a multi-bit class D amplifier.

FIG. 9B shows a block diagram of an M-bit XOR unit 260b and an M-bit class D amplifier 270b, which are another embodiment of XOR unit 260 and class D amplifier 270, respectively, in FIG. 2. XOR unit 260b receives a 1-bit phase modulated signal P(t) and an M-bit envelope signal E(t) and generates an M-bit digitally modulated signal X(t), where M>1. The M bits of the envelope signal E(t) are denoted as $E_1(t)$ through $E_M(t)$. The M bits of the digitally modulated signal X(t) are denoted as $X_1(t)$ through $X_M(t)$.

For the embodiment shown in FIG. 9B, XOR unit 260b is composed of M XOR gates 910a through 910m. Each XOR gate 910i, for i=a, . . . , m, receives the 1-bit phase modulated signal P(t) and one bit of the envelope signal, or $E_i(t)$. Each XOR gate 910i performs exclusive-OR on the two input signals and provides one bit of the digitally modulated signal, or $X_i(t)$.

Class D amplifier 270b includes M driver circuits 920a through 920m and M pairs of MOSFETs 930a and 932a through 930m and 932m. One driver circuit and one pair of MOSFETs are provided for each bit of the digitally modulated signal X(t).

For each bit i, where i=a, . . . , m, driver circuit 920i and MOSFETs 930i and 932i are coupled as described above for FIG. 9A. MOSFETs 930a and 932a are for the least significant bit (LSB) and have a normalized channel width of 1. Each subsequent pair of MOSFETs for a more significant bit has a normalized width that is twice the width of the preceding pair of MOSFETs. MOSFET and MOSFETs 930m and 932bm are for the most significant bit (MSB) and have a normalized width of $2^{M-1}$. The M pairs of MOSFETs thus have different drive capabilities. Each driver circuit 920i receives one bit of the digitally modulated signal, or $X_i(t)$, and provides two control signals for MOSFETs 930i and 932i. Each pair of MOSFETs 930i and 932i is thus turned on and off by a respective bit of the digitally modulated signal. The outputs of all M pairs of MOSFETs 930a and 932a through 930m and 932m are coupled together and drive the amplified signal A(t).

In general, XOR unit 260 digitally multiplies the phase modulated signal P(t) with the envelope signal E(t). XOR unit 260 may be implemented with one or more XOR gates, as shown in FIGS. 9A and 9B. The multiplication of P(t) with E(t) may also be achieved with other types of multipliers such as, e.g., mixers, Gilbert cell multipliers, and so on.

Class D amplifier 270 performs amplification of the digitally modulated signal X(t) and is power efficient. Other types and classes of amplifiers may also be used to amplify the digitally modulated signal.

Referring back to FIG. 2, voltage regulator 272 may be used to generate the supply voltage $V_{amp}$ for class D amplifier 270. Voltage regulator 272 may receive a higher power supply voltage $V_{bat}$ and may generate a lower amplifier supply voltage $V_{amp}$ for class D amplifier 270. Voltage regulator 272 may be used to improve power efficiency. Voltage regulator 272 may also be used for power control since the maximum output signal level from class D amplifier 270 is determined by the amplifier supply voltage $V_{amp}$. Voltage regulator 272 may also be omitted.

Figure 10:
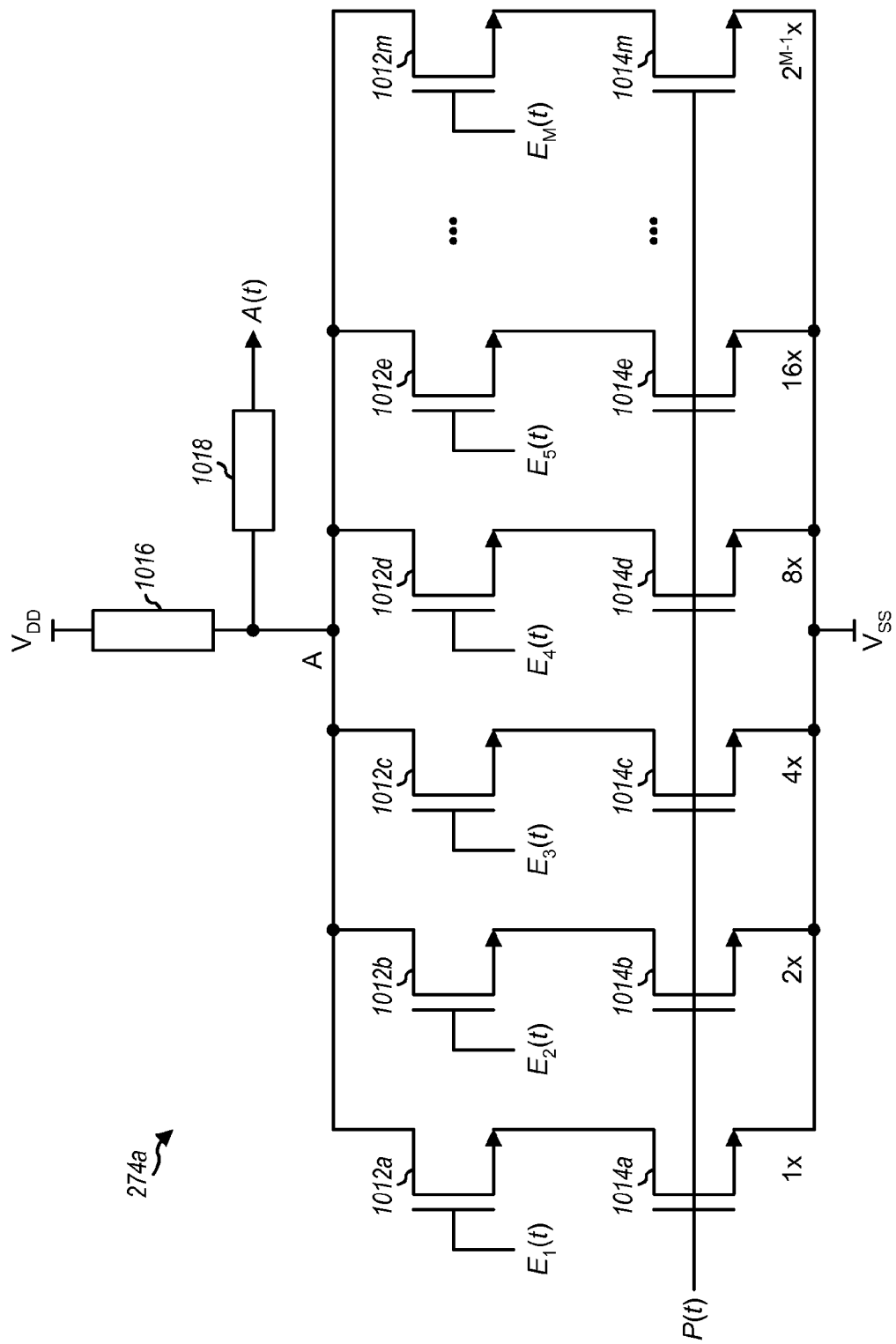
FIG. 10 shows a diagram of a multi-state amplifier.

FIG. 10 shows a schematic diagram of a multi-state amplifier 274a, which is an embodiment of amplifier 274 in FIG. 3. Amplifier 274a has $2^M$ gain states that may be selected by the M-bit envelope signal E(t) from FIR filter 234 in FIG. 3. Amplifier 274a includes M pairs of cascade coupled N-channel FETs (N-FETs) 1012a and 1014a through 1012m and 1014m. The lower N-FETs 1014a through 1014m have their sources coupled to circuit ground, their gates receiving the phase modulated signal P(t) from attenuator 256, and their drains coupled to the sources of the upper N-FETs 1012a through 1012m, respectively. N-FETs 1012a through 1012m have their gates receiving the M bits of the envelope signal E(t) and their drains coupled together and to a summing node A. An impedance matching element 1016 couples between node A and the power supply, $V_{DD}$. An impedance matching element 1018 couples between node A and the output of amplifier 274a. Elements 1016 and 1018 provide impedance matching for an external load impedance and may comprise inductors, capacitors, resistors, etc.

The M pairs of N-FETs may be binary weighted, as shown in FIG. 10. In this case, N-FETs 1012a and 1014a are half the size of N-FETs 1012b and 1014b, which are half the size of N-FETs 1012c and 1014c, which are half the size of N-FETs 1012d and 1014d, and so on. Thermometer weighted N-FETs with equal size may also be used for some or all of the M bits (e.g., for a predetermined number of the more significant bits) to improve matching for the $2^M$ gain states.

Amplifier 274a operates as follows. For each bit i, where i=a, . . . , m, if $E_i(t)$ is at logic high, then N-FET 1012i is turned on, and the drain current of N-FET 1014i is routed to summing node A and hence to the amplifier output. Conversely, if $E_i(t)$ is at logic low, then N-FET 1012i is turned off, and the drain current of N-FET 1014i is prevented from going to summing node A. N-FETs 1014a through 1014m are sized to operate in the saturation region. The linearity of N-FETs 1014a through 1014m is not important since the gates of these N-FETs receive the phase modulated signal P(t) having a constant amplitude.

The digital transmitters described herein may be used for various single-carrier and multi-carrier modulation techniques including (but not limited to) phase shift keying (PSK), binary PSK (BPSK), quadrature PSK (QPSK), quadrature amplitude modulation (QAM), continuous phase modulation (CPM), Gaussian minimum shift keying (GMSK), orthogonal frequency division multiplex (OFDM), interleaved FDMA (IFDMA), localized IFDMA (LFDMA), and so on. These modulation techniques are known in the art.

The digital transmitters may also be used for various systems and applications. For example, the digital transmitters may be used in wireless communication systems such as code division multiple access (CDMA) systems, time division multiple access (TDMA) system, frequency division multiple access (FDMA) systems, orthogonal frequency division multiple access (OFDMA) systems, Global System for Mobile Communications (GSM) systems, multiple-input multiple-output (MIMO) systems, wireless local area networks (LANs), and so on. A CDMA system may utilize cdma2000, Wideband-CDMA (W-CDMA), or some other radio access technology.

The digital transmitters may also be used for various frequency bands such as, for example, the cellular band from 824 to 894 MHz, the Personal Communication System (PCS) band from 1850 to 1990 MHz, the Digital Cellular System (DCS) band from 1710 to 1880 MHz, the GSM900 band from 890 to 960 MHz, the International Mobile Telecommunications-2000 (IMT-2000) band from 1920 to 2170 MHz, the CDMA450 band from 411 to 493 MHz, the JCDMA band 832 to 925 MHz, the KPCS band from 1750 to 1870 MHz, and so on. VCO 252 may be operated at one or multiple times the frequency of the desired RF channel, e.g., four times the cellular band, twice the PCS band, and so on.

The digital transmitters may be implemented within one or more integrated circuits (ICs), application specific integrated circuits (ASICs), digital signal processors (DSPs), digital signal processing devices (DSPDs), programmable logic devices (PLDs), field programmable gate array (FPGAs), and/or other electronic devices designed to perform the functions described herein. The digital transmitters may also be fabricated in various IC process technologies such as complementary metal oxide semiconductor (CMOS), N-MOS, P-MOS, bipolar-CMOS (Bi-CMOS), bipolar, and so on. CMOS technology can fabricate both N-FET and P-FET devices on the same IC die, whereas N-MOS technology can only fabricate N-FET devices and P-MOS technology can only fabricate P-FET devices. The digital transmitters may be fabricated using any device size technology (e.g., 130 nanometer (nm), 65 nm, 30 nm, and so on). The digital transmitters is generally more advantageous as IC process technology scales to smaller geometry.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
a first circuit block configured to receive a scaled magnitude signal having a first number of bits at a first sampling rate and generate an envelope signal having a second number of bits less than the first number of bits and at a second sampling rate greater than the first sampling rate;
a second circuit block configured to generate a phase modulated signal, the second circuit block further configured to divide a received feedback signal in frequency based on a frequency of a received desired RF channel to generate a divided signal and lock a phase of the divided signal to a phase of a received reference signal for generating the phase modulated signal;
a third circuit block configured to generate a digitally modulated signal based on the envelope signal and the phase modulated signal; and
a fourth circuit block configured to amplify the digitally modulated signal and generate an output signal.

2. The apparatus of claim 1, wherein the third circuit block comprises an amplifier having multiple gain states, the amplifier configured to receive the envelope signal and the phase modulated signal and to generate the digitally modulated signal.

3. The apparatus of claim 2, wherein the amplifier is configured to amplify the phase modulated signal with different gains determined by the envelope signal to generate the digitally modulated signal.

4. The apparatus of claim 1, wherein the third circuit block comprises at least one exclusive-OR (XOR) gate configured to receive the envelope signal and the phase modulated signal and to generate the digitally modulated signal.

5. The apparatus of claim 1, wherein the fourth circuit block comprises a class D amplifier having at least one amplifier stage.

6. The apparatus of claim 5, wherein each amplifier stage comprises a pair of transistors, and wherein each transistor is switched on and off based on the digitally modulated signal.

7. The apparatus of claim 5, wherein each amplifier stage comprises a pair of metal oxide semiconductor field effect transistors (MOSFETs), and wherein each MOSFET is switched on and off based on the digitally modulated signal.

8. The apparatus of claim 5, further comprising:
a voltage regulator configured to generate a supply voltage for the class D amplifier.

9. The apparatus of claim 1, wherein the first circuit block comprises a delta-sigma ($\Sigma\Delta$) modulator.

10. The apparatus of claim 9, wherein the $\Sigma\Delta$ modulator has a noise transfer function with at least one zero located at a frequency corresponding to a difference between transmit and receive frequencies.

11. The apparatus of claim 9, wherein the $\Sigma\Delta$ modulator has a programmable noise transfer function.

12. The apparatus of claim 1, wherein the first circuit block comprises a digital filter having a transfer function with at least one zero located at a frequency corresponding to a difference between transmit and receive frequencies.

13. The apparatus of claim 1, wherein the second circuit block comprises a phase modulating phase locked loop (PLL) configured to phase modulate a voltage controlled oscillator (VCO) to obtain a VCO signal having a phase that is varied by the phase modulating PLL.

14. The apparatus of claim 13, wherein the second circuit block further comprises a saturating buffer configured to amplify the VCO signal and to provide the phase modulated signal.

15. The apparatus of claim 13, wherein the phase modulating PLL comprises a multi-modulus divider configured to divide the VCO signal in frequency and to provide a divided VCO signal.

16. The apparatus of claim 15, wherein the phase modulating PLL further comprises a delta-sigma ($\Sigma\Delta$) modulator configured to receive a modulating signal and provide a control signal for the multi-modulus divider.

17. The apparatus of claim 16, wherein the phase modulating PLL further comprises at least one summer configured to add at least one value for a radio frequency (RF) channel with an output from the $\Sigma\Delta$ modulator to generate the control signal for the multi-modulus divider.

18. The apparatus of claim 15, wherein the phase modulating PLL further comprises a phase detector configured to compare phase of the divided VCO signal against phase of a reference signal and to provide a detector output signal having multiple bits of resolution.

19. The apparatus of claim 18, wherein the phase modulating PLL further comprises
a loop filter configured to filter the detector output signal and to provide a loop filter output signal, and
a delta-sigma digital-to-analog converter ($\Sigma\Delta$ DAC) configured to generate a control signal for the VCO based on the loop filter output signal.

20. The apparatus of claim 19, wherein the phase modulating PLL further comprises an interpolator configured to interpolate the loop filter output signal to generate an interpolated signal, and wherein the $\Sigma\Delta$ DAC is configured to generate the control signal for the VCO based on the interpolated signal.

21. The apparatus of claim 13, further comprising:
a VCO calibration unit configured to generate a control used to calibrate frequency of the VCO to account for integrated circuit process variations, temperature variations, or a combination thereof.

22. The apparatus of claim 1, further comprising:
a fifth circuit block configured to receive inphase and quadrature signals, to perform conversion from Cartesian to polar coordinates, and to generate magnitude and phase signals, wherein the first circuit block is configured to generate the envelope signal based on the magnitude signal, and wherein the second circuit block is configured to generate the phase modulated signal based on the phase signal.

23. The apparatus of claim 22, wherein the fifth circuit block comprises a Coordinate Rotational Digital Computer (CORDIC) processor configured to generate the magnitude and phase signals based on the inphase and quadrature signals.

24. The apparatus of claim 22, wherein the fifth circuit block comprises a look-up table.

25. The apparatus of claim 22, further comprising:
an interpolator configured to perform upsampling on inphase and quadrature data samples and provide the inphase and quadrature signals.

26. The apparatus of claim 1, wherein the output signal is a radio frequency (RF) modulated signal for a code division multiple access (CDMA) system.

27. The apparatus of claim 1, wherein the output signal is a radio frequency (RF) modulated signal for a Global System for Mobile Communications (GSM) system.

28. An integrated circuit comprising:
a first circuit block configured to receive a scaled magnitude signal having a first number of bits at a first sampling rate and generate an envelope signal having a second number of bits less than the first number of bits and at a second sampling rate greater than the first sampling rate;
a second circuit block configured to generate a phase modulated signal, the second circuit block further configured to divide a received feedback signal in frequency based on a frequency of a received desired RF channel to generate a divided signal and lock a phase of the divided signal to a phase of a received reference signal for generating the phase modulated signal;
a third circuit block configured to generate a digitally modulated signal based on the envelope signal and the phase modulated signal; and
a fourth circuit block configured to amplify the digitally modulated signal and generate an output signal.

29. The integrated circuit of claim 28, wherein the third circuit block comprises at least one exclusive-OR (XOR) gate configured to receive the envelope signal and the phase modulated signal and to generate the digitally modulated signal.

30. The integrated circuit of claim 28, wherein the fourth circuit block comprises a class D amplifier having at least one amplifier stage.

31. The integrated circuit of claim 28, further comprising:
a fifth circuit block configured to receive inphase and quadrature signals, to perform conversion from Cartesian to polar coordinates, and to generate magnitude and phase signals, wherein the first circuit block is configured to generate the envelope signal based on the magnitude signal, and wherein the second circuit block is configured to generate the phase modulated signal based on the phase signal.

32. An apparatus comprising:
means for receiving a scaled magnitude signal having a first number of bits at a first sampling rate and generating an envelope signal having a second number of bits less than the first number of bits and at a second sampling rate greater than the first sampling rate;
means for generating a phase modulated signal, the means further for dividing a received feedback signal in frequency based on a frequency of a received desired RF channel to generate a divided signal and locking a phase of the divided signal to a phase of a received reference signal for generating the phase modulated signal;
means for generating a digitally modulated signal based on the envelope signal and the phase modulated signal; and
means for amplifying the digitally modulated signal to generate an output signal.

33. The apparatus of claim 32, further comprising:
means for generating magnitude and phase signals based on inphase and quadrature signals.

34. An apparatus comprising:
a first circuit block configured to receive inphase and quadrature signals, to perform conversion from Cartesian to polar coordinates, and to generate magnitude and phase signals;
a second circuit block comprising a delta-sigma ($\Sigma\Delta$) modulator and configured to receive a scaled magnitude signal having a first number of bits at a first sampling rate and generate an envelope signal based on the scaled magnitude signal, the envelope signal having a second number of bits less than the first number of bits and at a second sampling rate greater than the first sampling rate;
a third circuit block comprising a phase modulating phase locked loop (PLL) and configured to generate a phase modulated signal based on the phase signal, the third circuit block further configured to divide a received feedback signal in frequency based on a frequency of a received desired RF channel to generate a divided signal and lock a phase of the divided signal to a phase of a received reference signal for generating the phase modulated signal;
a fourth circuit block configured to generate a digitally modulated signal based on the envelope signal and the phase modulated signal; and
a fifth circuit block comprising a class D amplifier and configured to amplify the digitally modulated signal to generate an output signal.

35. The apparatus of claim 34, wherein the fourth circuit block comprises at least one exclusive-OR (XOR) gate configured to receive the envelope signal and the phase modulated signal and to generate the digitally modulated signal.

36. The apparatus of claim 34, wherein the fifth circuit block comprises a class D amplifier having at least one amplifier stage, wherein each amplifier stage comprises a pair of metal oxide semiconductor field effect transistors (MOSFETs), and wherein each MOSFET is switched on and off based on the digitally modulated signal.

* * * * *